(12) United States Patent
Shortz

(10) Patent No.: US 7,130,785 B2
(45) Date of Patent: Oct. 31, 2006

(54) SYSTEM AND METHOD FOR DETECTING ACCESSES TO NON-EXISTING HARDWARE ENTITIES USING ARCHITECTURAL SIMULATION

(75) Inventor: Richard Shortz, Keller, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 662 days.

(21) Appl. No.: 10/303,427

(22) Filed: Nov. 25, 2002

(65) Prior Publication Data

US 2004/0102944 A1    May 27, 2004

(51) Int. Cl.
*G06F 17/50* (2006.01)
*G06G 7/62* (2006.01)

(52) U.S. Cl. .......................................................... 703/17

(58) Field of Classification Search .................. 326/93; 370/218, 392; 703/13–17, 20, 22, 23, 27, 703/28; 709/248; 714/33, 38, 41, 7; 717/124, 717/141, 149; 716/1, 5, 18
See application file for complete search history.

(56) References Cited

U.S. PATENT DOCUMENTS

| 5,671,352 | A | | 9/1997 | Subrahmaniam et al. |
| 5,848,236 | A | * | 12/1998 | Dearth et al. .................. 714/33 |
| 6,298,320 | B1 | | 10/2001 | Buckmaster et al. |
| 6,339,836 | B1 | * | 1/2002 | Eisenhofer et al. ............ 716/5 |
| 6,466,898 | B1 | * | 10/2002 | Chan ........................... 703/17 |

* cited by examiner

*Primary Examiner*—Paul Rodriguez
*Assistant Examiner*—Juan Carlos Ochoa

(57) ABSTRACT

A system and method for detecting accesses to non-existing hardware entities using a simulator environment. When an application running on a simulated target platform issues a transaction that involves accessing a hardware address, wherein the address is within a range of addresses allocated to a simulated hardware block, a set of instructions provided with the simulator are operable to determine if there exists a backing that corresponds to the transaction's address. If there is no backing (i.e., a control status register) associated with the address, an appropriate notification or warning is provided as a response.

36 Claims, 6 Drawing Sheets

SYSTEM AND METHOD FOR DETECTING ACCESSES TO NON-EXISTING HARDWARE ENTITIES USING ARCHITECTURAL SIMULATION

BACKGROUND

Architecting reliable software for high performance computing platforms has become a daunting task. In today's multiprocessor (MP) systems having a large number of processors in various architectural arrangements, the task is even more challenging. Because the teachings of the present invention will be exemplified in particular reference to MP platforms, a brief introduction thereto is set forth below.

In the most general sense, multiprocessing may be defined as the use of multiple processors to perform computing tasks. The term could apply to a set of networked computers in different locations, or to a single system containing several processors. As is well known, however, the term is most often used to describe an architecture where two or more linked processors are contained in a single or partitioned enclosure. Further, multiprocessing does not occur just because multiple processors are present. For example, having a stack of personal computers in a rack is not multiprocessing. Similarly, a server with one or more "standby" processors is not multiprocessing, either. The term "multiprocessing" is typically applied, therefore, only to architectures where two or more processors are designed to work in a cooperative fashion on a task or set of tasks.

There exist numerous variations on the basic theme of multiprocessing. In general, these variations relate to how independently the processors operate and how the workload among these processors is distributed. In loosely-coupled multiprocessing architectures, the processors perform related tasks but they do so as if they were standalone processors. Each processor is typically provided with its own private memory and may have its own mass storage and input/output (I/O). Further, each loosely-coupled processor runs its own copy of an operating system (OS), and communicates with the other processor or processors through a message-passing scheme, much like devices communicating over a local area network. Loosely-coupled multiprocessing has been widely used in mainframes and minicomputers, but the software to do so is closely tied to the hardware design. For this reason, among others, it has not gained the support of software vendors and is not widely used in today's high performance server systems.

In tightly-coupled multiprocessing, on the other hand, operation of the processors is more closely integrated. They typically share main memory, and may even have a shared cache. The processors need not be identical to one another, and may or may not perform similar tasks. However, they typically share other system resources such as mass storage and I/O. Additionally, instead of a separate copy of the OS for each processor, they run a single copy, with the OS handling the coordination of tasks between the processors. The sharing of system resources makes tightly-coupled multiprocessing platforms somewhat less expensive, and it is the dominant multiprocessor architecture in the business-class servers currently deployed.

Hardware architectures for tightly-coupled MP platforms can be further divided into two broad categories. In symmetrical MP (SMP) systems, system resources such as memory, disk storage and I/O are shared by all the microprocessors in the system. The workload is distributed evenly to available processors so that one does not sit idle while another is heavily loaded with a specific task. Further, the SMP architecture is highly scalable, i.e., the performance of SMP systems increases, at least theoretically, as more processor units are added.

In asymmetrical MP systems, tasks and resources are managed by different processor units. For example, one processor unit may handle I/O and another may handle network OS (NOS)-related tasks. Thus, it should be apparent that an asymmetrical MP system may not balance the workload and, accordingly, it is possible that a processor unit handling one task can be overworked while another unit sits idle.

SMP systems are further subdivided into two types, depending on the way cache memory is implemented. "Shared-cache" platforms, where off-chip (i.e., Level 2, or L2) cache is shared among the processors, offer lower performance in general. In "dedicated-cache" systems, every processor unit is provided with a dedicated L2 cache, in addition to its on-chip (Level 1, or L1) cache memory. The dedicated L2 cache arrangement accelerates processor-memory interactions in the multiprocessing environment and, moreover, facilitates higher scalability.

As alluded to at the beginning, designing software intended for reliable cross-platform execution on numerous MP systems available nowadays has become an arduous undertaking. Further, with ever-shrinking design/debug cycle times, software developers are continuously looking for ways to streamline the debug operations necessary to architect well-tested code, be it application software, OS software, or firmware (collectively, "applications").

A particular difficulty arises when a software application is afflicted with latent errors that may go largely unnoticed when it is actually executed on a machine. For instance, a software application may involve transactions that require access to hardware and, at times, a transaction may be directed to a non-existent hardware address. Typically, that is not a problem because the system hardware (each hardware block having a range of addresses supported by control status registers with appropriate initialization information) simply ignores the access transaction when there is no backing and continues to stay in operational mode without raising any alarm. Instead, some undefined value may be returned to the application. This is usually the case since the operational paradigm of high availability MP systems requires that the hardware not go off-line unless it is somehow critically impacted. However, the application code (and the user) does not have the opportunity to realize that an improper access operation to non-existent hardware registers has been issued during the execution. Since the hardware is not designed to catch such accesses and the software application may continue to execute based on some undefined values returned from the hardware, the dynamic behavior and reliability of the application is somewhat compromised. In addition, the problem can be compounded by the fact that oftentimes the hardware development of a particular platform may not have advanced far enough to allow complete testing of the software code targeted for that platform.

SUMMARY

A system and method for detecting accesses to non-existing hardware entities using a simulator environment is disclosed. In one embodiment, when an application running on a simulated target platform issues a transaction that involves accessing a hardware address, wherein the address is within a range of addresses allocated to a simulated hardware block, a set of instructions provided with the simulator are operable to determine if there exists a backing that corresponds to the transaction's address. If there is no backing (i.e., a control status register) associated with the address, an appropriate notification or warning is provided as a response.

DETAILED DESCRIPTION OF THE DRAWINGS

Figure 1:
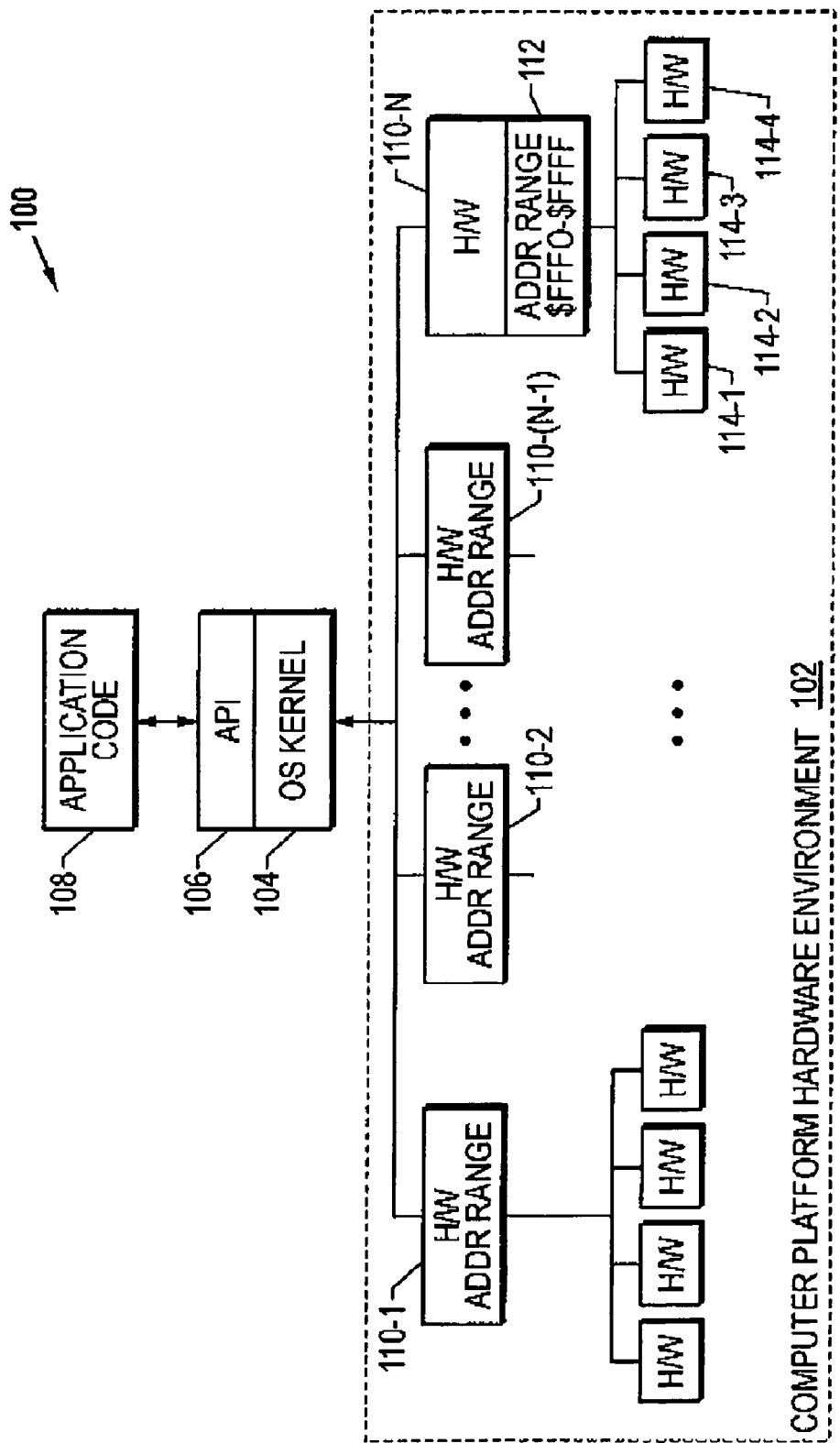
FIG. 1 (Prior Art) depicts a functional block diagram of a conventional computer system wherein an access to a non-existent entity by an application is ignored.

In the drawings, like or similar elements are designated with identical reference numerals throughout the several views thereof, and the various elements depicted are not necessarily drawn to scale. Referring now to FIG. 1, depicted therein is a functional block diagram of a conventional computer system 100 wherein accesses to a non-existing entity caused by a user application program 108 are typically ignored. The computer system 100 includes a platform hardware environment 102 that can be organized in any known or heretofore unknown fashion, and may be comprised of uniprocessor or multiprocessor architectures. An OS kernel 104 supports an Application Programming Interface (API) layer 106 for facilitating communication between the software code of the user application 108 and the underlying hardware platform environment 102.

As is well known, the computer hardware forming the platform environment 102 is assigned a range of addresses that are used for effectuating access thereto pursuant to a transaction initiated by the user application 108. Further, the platform environment 102 may be partitioned into a plurality of hardware functionality blocks 110-1 through 110-N, each hardware functionality block having a corresponding range of address space. Each hardware functionality block is operable to support a range of hardware entities, such as processors, memory, mass storage devices and other peripherals, and the like, by further refining its address space. By way of illustration, an address range 112 of $FFF0–$FFFF is assigned to the hardware functionality block 110-N that is associated with hardware units 114-1 to 114-4. An address refining mechanism, which will be described in further detail hereinbelow, is provided with the hardware functionality blocks for facilitating access to the various hardware units supported. In addition, a hardware functionality block includes one or more control status registers (CSRs) that are populated with appropriate initialization information, wherein each CSR manages access to a particular hardware unit depending on the address captured and refined by the hardware functionality block. Accordingly, when a transaction generated by the user application initiates a hardware access operation using an address that does not correspond to a properly initialized CSR (i.e., "backing") in a hardware functionality block, that access is essentially undefined (hence, illegal) and may be ignored by the hardware functionality block. However, the conventional hardware systems, as alluded to hereinabove in the Background section of the present patent application, do not issue any error reports or provide a suitable alarm or warning to the user indicating that access to a non-existent entity has been attempted. Also, in general, the hardware functionality block that captures the transaction and refines the address does not pause its operation or otherwise go "off-line", either, on account of the attempted access to a non-existent entity.

Figure 2:
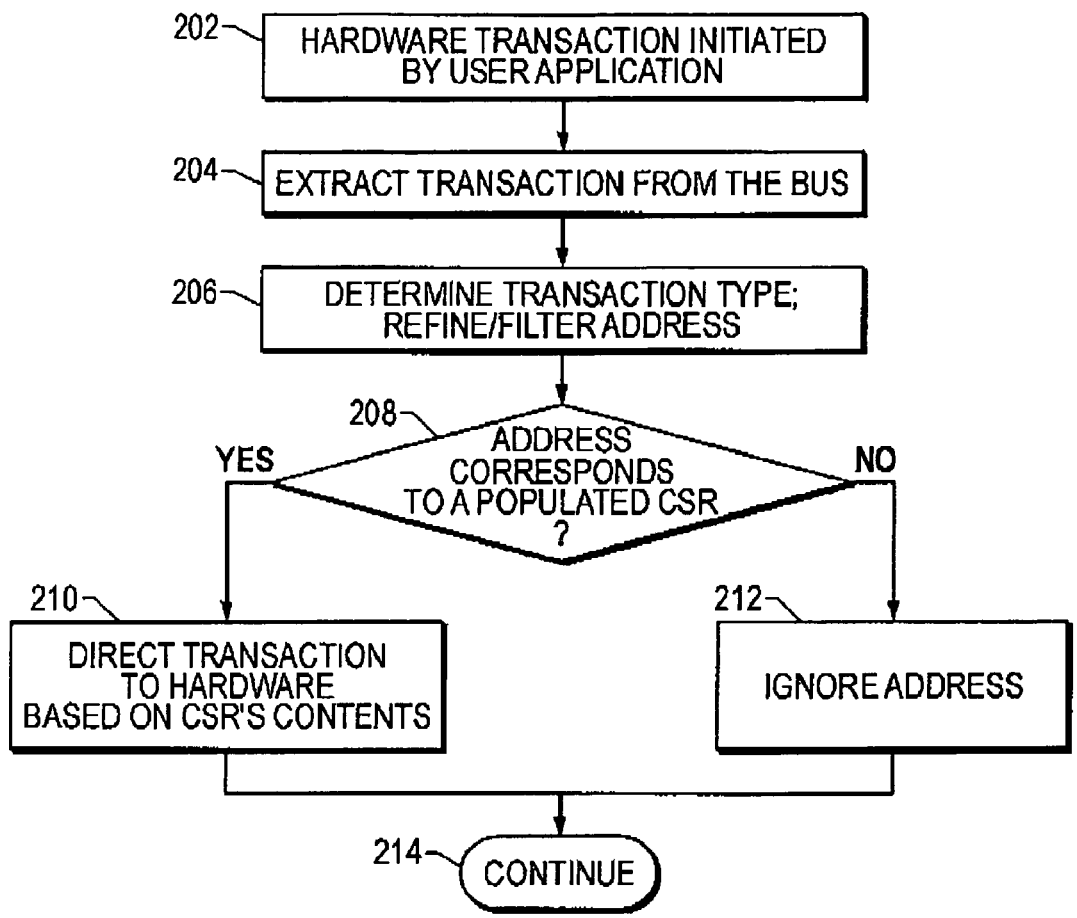
FIG. 2 (Prior Art) is a flow chart illustrating a conventional method of handling an application's access to a non-existent entity.

FIG. 2 depicts a flow chart that illustrates a conventional method of handling an application's access to a non-existing entity in a system. When an action requiring access to hardware is initiated by the user application, a transaction is issued on a bus that couples the various hardware entities of the system (block 202). Depending on the address information associated with the action, the transaction is extracted from the bus by a hardware functionality block (block 204) which determines the transaction type and refines or filters the address information (block 206). If the refined address has backing, i.e., the address corresponds to a populated CSR (decision block 208), the transaction is directed to a particular hardware unit, e.g., a processor, cellular partition, protected memory space, input/output block, et cetera (block 210). On the other hand, if there is no CSR that corresponds to the refined address, the access transaction and its address are ignored by the hardware functionality block (block 212). Thereafter, the operation of the system continues without pause or any indication of the attempted hardware access (block 214).

Figure 3:
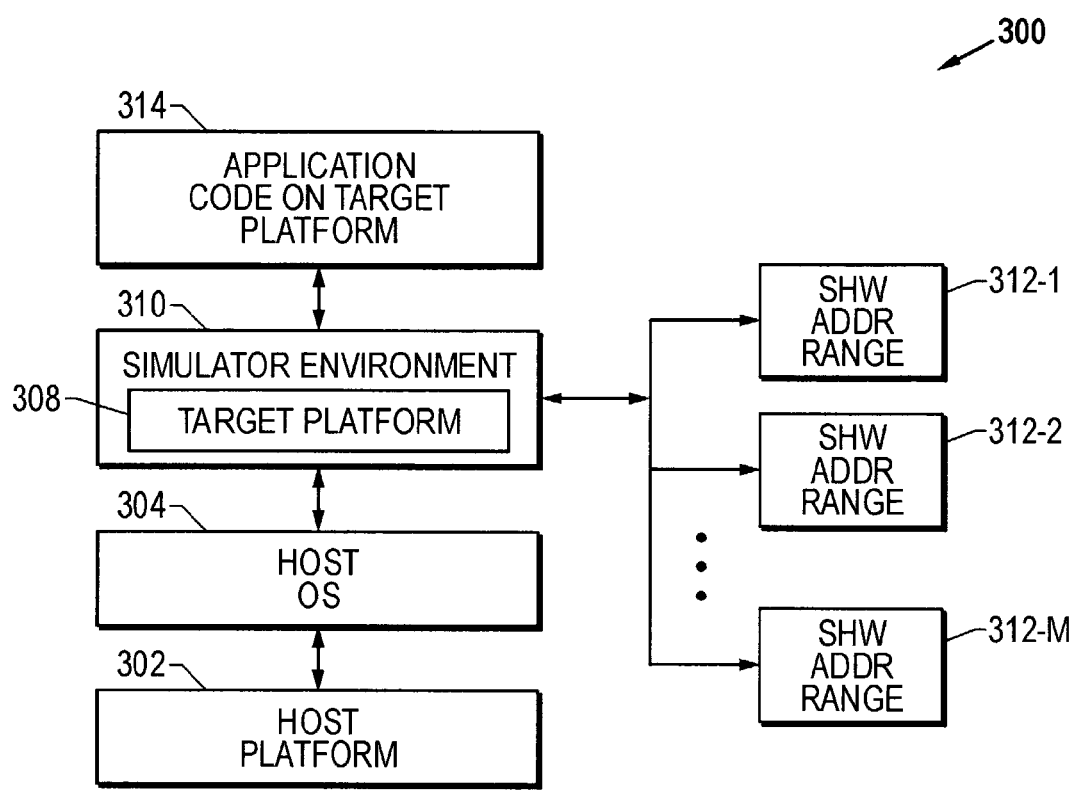
FIG. 3 depicts a functional block diagram of a system supporting a simulator environment wherein an access to a non-existent entity by an application is detected.

Referring now to FIG. 3, depicted therein is a functional block diagram of an embodiment of a system 300 operable to support a simulator environment 310 wherein accesses to non-existent hardware entities by an application are advantageously detected. System 300 comprises a host machine 302 organized in any known computer architecture wherein a host OS 304 executing thereon is operable to provide a software platform. Simulator environment 310 is provided as a software rendition capable of running on the host OS, and may be embodied as an architectural simulator that can simulate a target computer platform 308.

Depending on design objectives, the target platform 308 may comprise a single processor, dual processor, or multi-processor system. Application code 314 intended for execution, optimization, and maintenance on the target platform 308 is provided as a software code portion running in the simulator environment 310. Various hardware functionality blocks of the target platform are also simulated as part of the software rendition of the target system. Accordingly, a plurality of simulated hardware (SHW) blocks 312-1 through 312-M are provided as part of the simulator environment 310. Each SHW block is allocated an address range, wherein a particular SHW block may include one or more simulated CSRs for controlling access to appropriate partitions of the allocated hardware address space.

Figure 4:
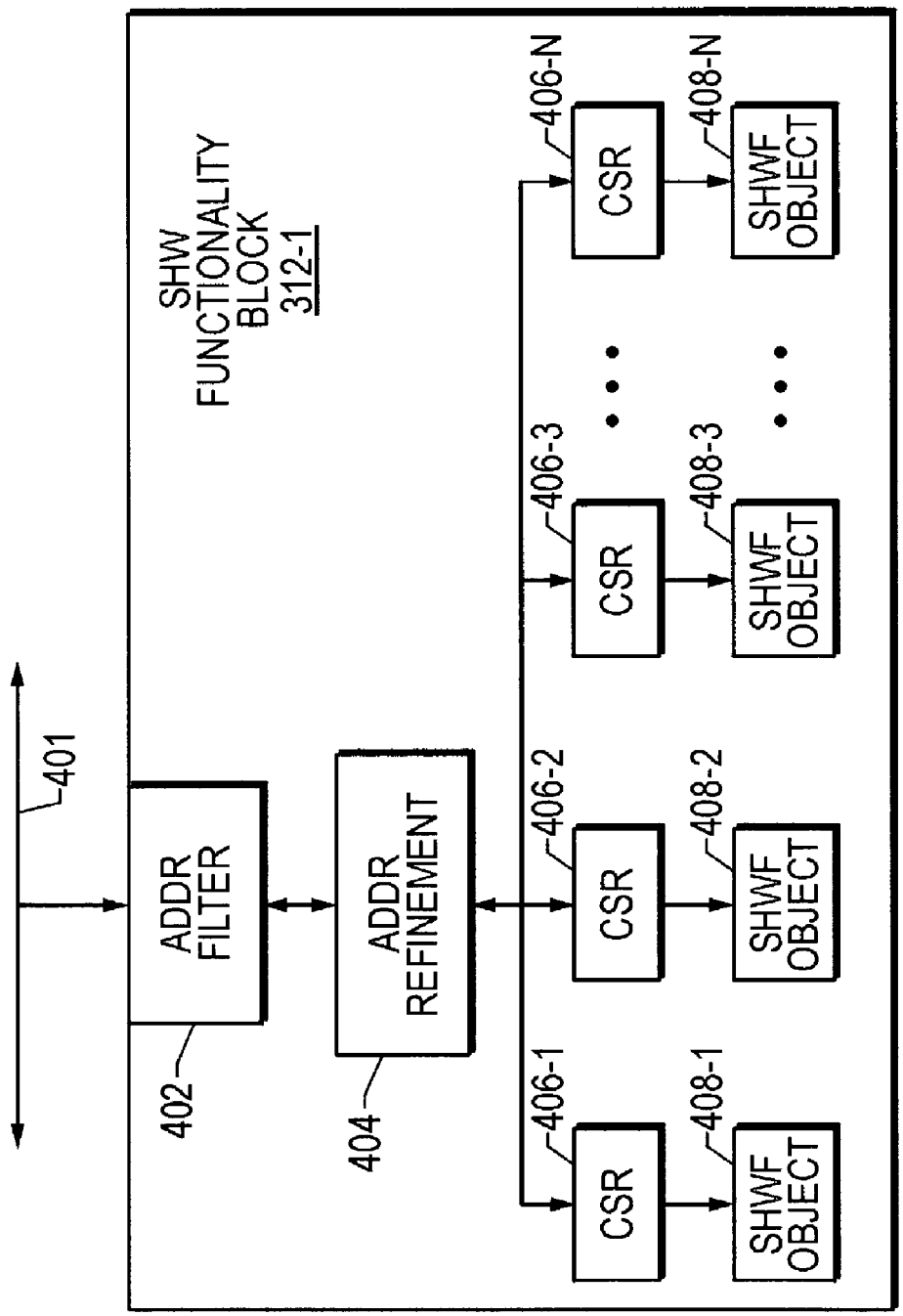
FIG. 4 depicts a functional block diagram of a simulated hardware block exemplified in FIG. 3.

FIG. 4 depicts a functional block diagram of a simulated hardware functionality block, such as SHW block 312-1 provided as part of the system 300 described hereinabove, that can be conceptualized as being interconnected via a simulated bus 401 to a number of such blocks as part of the simulated target platform. As mentioned previously, a block of addresses is allocated to the SHW block 312-1, which is operable to capture an access transaction issued on the bus 401 based on the address of the access transaction, wherein the transaction address is partially defined initially. An address filter 402 and an address refinement mechanism 404 are provided for further refining the captured address so as to determine the hardware address location being accessed. A plurality of simulated CSRs 406-1 through 406-N provide the simulated backing for at least a portion of the allocated address range. Each populated CSR is operable to control access to a simulated hardware functionality object associated therewith. Accordingly, reference numerals 408-1 through 408-N refer to a plurality hardware functionality objects existing as part of SHW 312-1 of the simulated platform.

Figure 5:
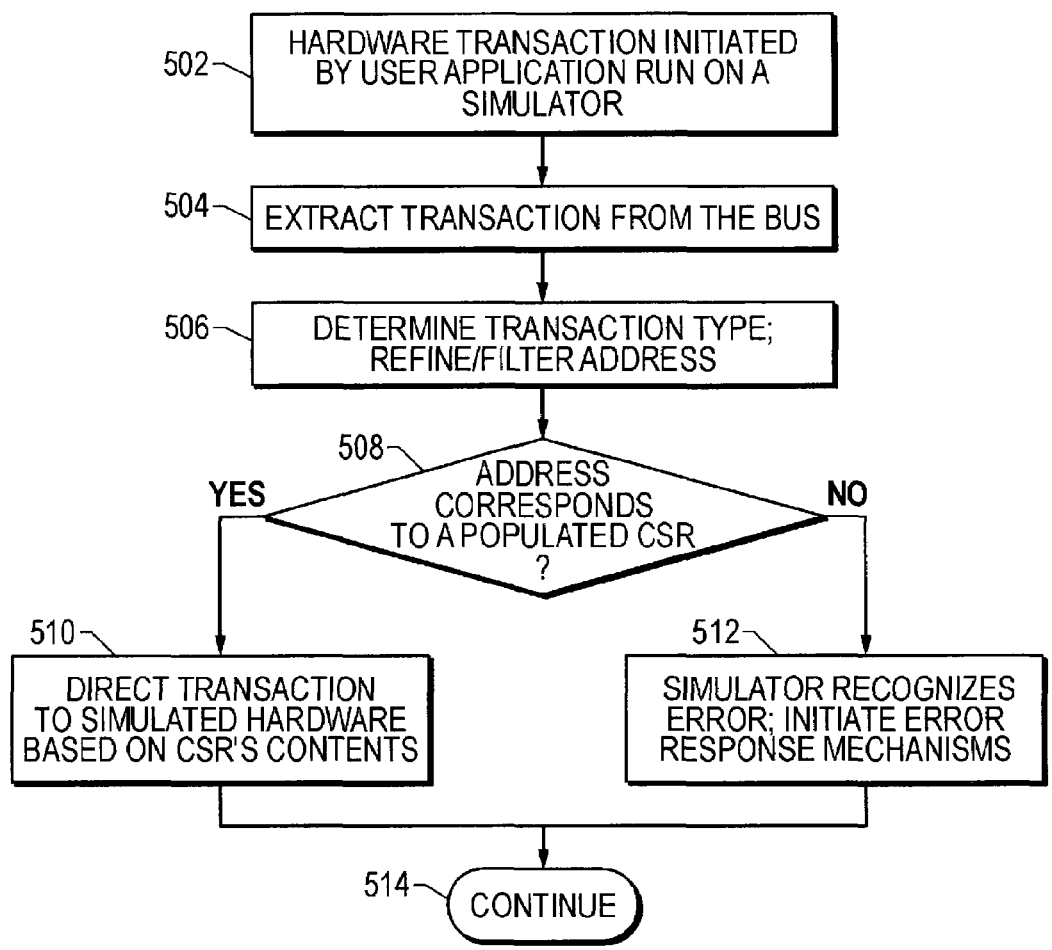
FIG. 5 is a flow chart of the various steps illustrating an embodiment of methodology for handling an application's access to a non-existent entity in the simulator environment shown in FIG. 3.

Referring now to FIG. 5, shown therein is a flow chart of the various steps of an embodiment of methodology for handling an application's access to a non-existent entity in the simulator environment depicted in FIG. 3. When a hardware access transaction is initiated by a user application executed on a simulator (block 502), the transaction is extracted from the bus by an SHW whose address space contains the address associated with the transaction (block 504). The captured address is further filtered and refined in the SHW block. The transaction type may also be determined therein (block 506). A determination is made to verify whether there exists a populated CSR that corresponds to the refined hardware address location to which access is being attempted (decision block 508). If there is a corresponding CSR, the access transaction is directed to a simulated hardware object based on the CSR's contents (block 510) and the user application may continue to execute (block 514). Otherwise, the simulator recognizes that an error condition has taken place. Further, a variety of error response mechanisms may be implemented such as, e.g., (i) reporting the error to the user; (ii) terminating the application that initiated access to a non-existent hardware entity; (iii) terminating the simulator; and (iv) providing an alert and continuing to execute the application. These response mechanisms are consolidated in block 512. It should be apparent that any combination of the responses may be implemented in a particular system.

Figure 6:
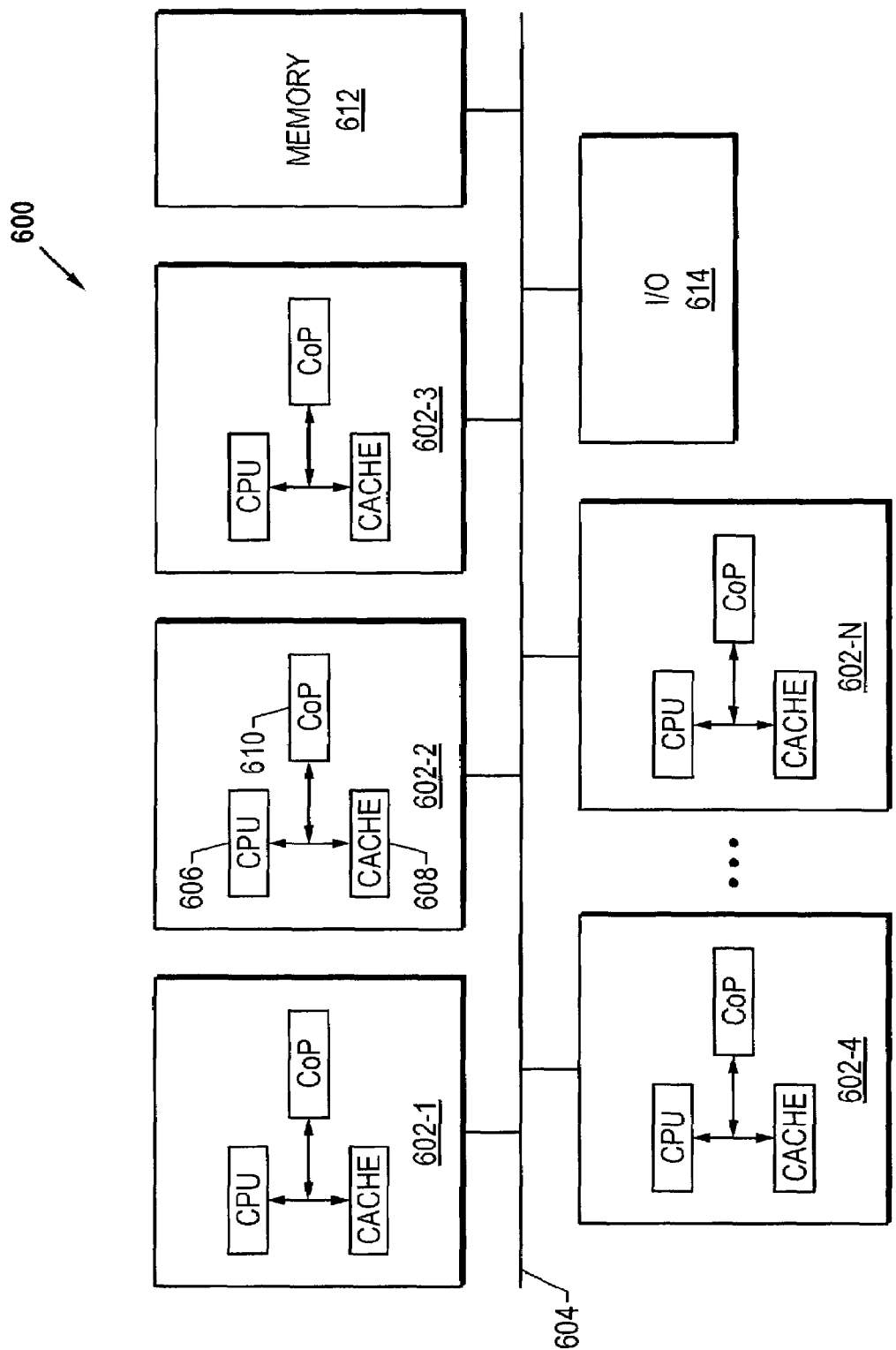
FIG. 6 depicts a block diagram of an exemplary target MP system simulated in an architectural simulator.

FIG. 6 depicts a block diagram of an exemplary target MP system 600 simulated in an architectural simulator. Reference numerals 602-1 through 602-N refer to a plurality of processor complexes interconnected together via a high performance, MP-capable bus 604. Each processor complex, e.g., processor complex 602-2, is comprised of at least one central processing unit (CPU) 606, a cache memory 608, and one or more coprocessors 610. In one implementation, the MP system is architected as a tightly coupled SMP system where all processors have uniform access to a main memory 612 and any input/output (I/O) device 614 in a shared fashion. As an SMP platform, each processor has equal capability to enable any kernel task to execute on any processor in the system. Whereas threads may be scheduled in parallel fashion to run on more than one processor complex, a single kernel controls all hardware and software in an exemplary implementation of the MP system 600, wherein locking and synchronization strategies provide the kernel the means of controlling MP events.

Each processor complex may be provided with its own data structures, including run queues, counters, time-of-day information, notion of current process(es) and priority. Global data structures available for the entire MP system 600 are protected by means such as semaphores and spinlocks. Furthermore, in other implementations of the MP system, the processors may be arranged as "cells" wherein each cell is comprised of a select number of processors (e.g., four, six, or eight processors), interrupts, registers and other resources.

The architectural simulator program operable to simulate a hardware platform such as the MP system 600 is preferably provided with appropriate instructions to carry out the access detection system and method described in greater detail hereinabove. Any software application intended for execution on the MP system may, accordingly, be debugged, tested, and optimized on the architectural simulator even before the target hardware platform is completely assembled and verified.

Based on the foregoing, those skilled in the art should appreciate that method and apparatus have been described that may use an architectural simulator system to detect accesses to non-existent entities, whereby appropriate responses may be generated for the benefit of users and software developers. Based on the responses generated, accordingly, bugs in an application that cause such access transactions can be fixed early in the code development cycle before a target platform and associated application software are committed to production, where the ability to discover such bugs is substantially reduced while the potential for unknown software behavior remains high.

Although the invention has been particularly described with reference to certain illustrations, it is to be understood that the forms of the invention shown and described are to be treated as exemplary embodiments only. Various changes, substitutions and modifications can be realized without departing from the spirit and scope of the invention as defined by the appended claims.

What is claimed is:

1. A system for detecting accesses to non-existing hardware entities comprising:
    means for examining an address associated with a transaction issued by an application running on a target computer platform that is simulated by an architectural simulator rendered on a host, wherein said transaction's address is within a range of addresses allocated to a simulated hardware block that forms a portion of said target computer platform; and
    means for initiating an action in response to determining that a control status register corresponding to said transaction's address is absent in said simulated hardware block.

2. The system for detecting accesses to non-existing hardware entities as recited in claim 1, wherein said means for initiating an action comprises means for notifying said application that said transaction involves accessing a non-existent hardware entity.

3. The system for detecting accesses to non-existing hardware entities as recited in claim 1, wherein said means for initiating an action comprises means for terminating said architectural simulator.

4. The system for detecting accesses to non-existing hardware entities as recited in claim 1, wherein said means for initiating an action comprises means for providing an alarm to a user.

5. The system for detecting accesses to non-existing hardware entities as recited in claim 1, wherein said target computer platform comprises a multiprocessor computer system selected from at least one of a symmetrical multiprocessor system, an asymmetrical multiprocessor system, a loosely-coupled multiprocessor system and a tightly-coupled multiprocessor system.

6. The system for detecting accesses to non-existing hardware entities as recited in claim 1, wherein said control status register is associated with a simulated processor block.

7. The system for detecting accesses to non-existing hardware entities as recited in claim 1, wherein said control status register is associated with a simulated memory block.

8. The system for detecting accesses to non-existing hardware entities as recited in claim 1, wherein said control status register is associated with a simulated cellular partition of said target computer platform.

9. The system for detecting accesses to non-existing hardware entities as recited in claim 1, wherein said control status register is associated with a simulated input/output block.

10. A method of detecting accesses to non-existing hardware entities, comprising:
examining an address associated with a transaction issued by an application running on a target computer platform that is simulated by an architectural simulator rendered on a host, wherein said transaction's address is within a range of addresses allocated to a simulated hardware block that forms a portion of said target computer platform;
determining if there exists in said simulated hardware block a control status register corresponding to said transaction's address; and
initiating an action in response to determining that said control status register corresponding to said transaction's address is absent in said simulated hardware block.

11. The method of detecting accesses to non-existing hardware entities as recited in claim 10, wherein said action comprises notifying said application that said transaction involves accessing a non-existing hardware entity.

12. The method of detecting accesses to non-existing hardware entities as recited in claim 10, wherein said action comprises terminating said architectural simulator.

13. The method of detecting accesses to non-existing hardware entities as recited in claim 10, wherein said action comprises providing a warning to a user.

14. The method of detecting accesses to non-existing hardware entities as recited in claim 10, wherein said transaction is issued by said application on said target computer platform comprising a multiprocessor computer system.

15. The method of detecting accesses to non-existing hardware entities as recited in claim 14, wherein said multiprocessor computer system is selected from at least one of a symmetrical multiprocessor system, an asymmetrical multiprocessor system, a loosely-coupled multiprocessor system and a tightly-coupled multiprocessor system.

16. The method of detecting accesses to non-existing hardware entities as recited in claim 10, wherein said control status register is associated with a simulated processor block.

17. The method of detecting accesses to non-existing hardware entities as recited in claim 10, wherein said control status register is associated with a simulated memory block.

18. The method of detecting accesses to non-existing hardware entities as recited in claim 10, wherein said control status register is associated with a simulated cellular partition of said target computer platform.

19. The method of detecting accesses to non-existing hardware entities as recited in claim 10, wherein said control status register is associated with a simulated input/output block.

20. An architectural simulator for detecting accesses to non-existing hardware entities, said architectural simulator operating as code executed on a host machine, comprising:
instructions for examining an address associated with a transaction issued by an application running on a target computer platform that is simulated by said architectural simulator, wherein said transaction's address is within a range of addresses allocated to a simulated hardware block that forms a portion of said target computer platform;
instructions for determining if there exists in said simulated hardware block a control status register corresponding to said transaction's address; and
instructions for initiating an action in response to determining that said control status register corresponding to said transaction's address is absent in said simulated hardware block.

21. The architectural simulator for detecting accesses to non-existing hardware entities as recited in claim 20, wherein said instructions for initiating an action comprise instructions for notifying said application that said transaction involves accessing a non-existing hardware entity.

22. The architectural simulator for detecting accesses to non-existing hardware entities as recited in claim 20, wherein said instructions for initiating an action comprise instructions for terminating said application.

23. The architectural simulator for detecting accesses to non-existing hardware entities as recited in claim 20, wherein said instructions for initiating an action comprise instructions for providing a warning to a user.

24. The architectural simulator for detecting accesses to non-existing hardware entities as recited in claim 20, wherein said transaction is issued by said application on said target computer platform comprising a multiprocessor computer system.

25. The architectural simulator for detecting accesses to non-existing hardware entities as recited in claim 20, wherein said control status register is associated with a simulated processor block.

26. The architectural simulator for detecting accesses to non-existing hardware entities as recited in claim 20, wherein said control status register is associated with a simulated memory block.

27. The architectural simulator for detecting accesses to non-existing hardware entities as recited in claim 20, wherein said control status register is associated with a simulated cellular partition of said target computer platform.

28. The architectural simulator for detecting accesses to non-existing hardware entities as recited in claim 20, wherein said control status register is associated with a simulated input/output block.

29. A computer system, comprising: an Operating System (OS) operable to support an architectural simulator, said architectural simulator for simulating a target computer platform having at least one processor;
instructions associated with said architectural simulator for examining an address related to a transaction that is issued by an application running on said target computer platform, wherein said transaction's address is within a range of addresses allocated to a simulated hardware block that forms a portion of said target computer platform;
instructions associated with said architectural simulator for determining if there exists in said simulated hardware block a control status register corresponding to said transaction's address; and instructions associated with said architectural simulator for initiating an action in response to determining that said control status register corresponding to said transaction's address is absent in said simulated hardware block.

30. The computer system as recited in claim 29, wherein said instructions for initiating an action comprise instructions for notifying said application that said transaction involves accessing a non-existing hardware entity.

31. The computer system as recited in claim 29, wherein said instructions for initiating an action comprise instructions for terminating said architectural simulator.

32. The computer system as recited in claim 29, wherein said instructions for initiating an action comprise instructions for providing a warning to a user.

33. The computer system as recited in claim 29, wherein said control status register is associated with a simulated processor block.

34. The computer system as recited in claim 29, wherein said control status register is associated with a simulated memory block.

35. The computer system as recited in claim 29, wherein said control status register is associated with a simulated cellular partition of said target computer platform.

36. The computer system as recited in claim 29, wherein said control status register is associated with a simulated input/output block.

* * * * *